(12) United States Patent
Kong et al.

(10) Patent No.: US 11,284,518 B1
(45) Date of Patent: Mar. 22, 2022

(54) SEMICONDUCTOR PACKAGE WITH CO-AXIAL BALL-GRID-ARRAY

(71) Applicant: Intel Corporation, Santa Clara, CA (US)

(72) Inventors: Jackson Chung Peng Kong, Tanjung Tokong Pulau Pinang (MY); Bok Eng Cheah, Gelugor Pulau Pinang (MY); Jenny Shio Yin Ong, Payan Lepas Pulau Pinang (MY); Seok Ling Lim, Kulim Kedah (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/089,748

(22) Filed: Nov. 5, 2020

(30) Foreign Application Priority Data

Sep. 1, 2020 (MY) .............................. PI2020004493

(51) Int. Cl.
*H05K 1/16* (2006.01)
*H05K 3/34* (2006.01)
*H05K 1/18* (2006.01)

(52) U.S. Cl.
CPC ........... *H05K 3/3436* (2013.01); *H05K 1/183* (2013.01); *H05K 2201/10371* (2013.01)

(58) Field of Classification Search
CPC ................. H05K 3/3436; H05K 1/183; H05K 2201/10371
USPC ........................................................ 174/260
See application file for complete search history.

(56) References Cited

U.S. PATENT DOCUMENTS

| | | | |
|---|---|---|---|
| 2013/0206468 A1* | 8/2013 | Rathburn ............. | H05K 1/0228 174/263 |
| 2013/0244490 A1* | 9/2013 | Rathburn ................. | H05K 3/10 439/628 |
| 2014/0091428 A1* | 4/2014 | Hossain .............. | H01L 23/5389 257/532 |
| 2015/0194388 A1* | 7/2015 | Pabst .................. | H01L 23/3128 257/659 |
| 2020/0168569 A1 | 5/2020 | Vadlamani et al. | |

* cited by examiner

*Primary Examiner* — Andargie M Aychillhum
(74) *Attorney, Agent, or Firm* — Viering, Jentschura & Partner MBB

(57) ABSTRACT

According to various examples, a device is described. The device may include a printed circuit board. The device may also include a first recess in the printed circuit board, wherein the first recess comprises a circular side surface and a bottom surface. The device may also include a first solder ball disposed in the first recess. The device may also include a first conductive wall positioned behind the circular side surface of the first recess, wherein the first conductive wall surrounds a side surface of the first solder ball.

20 Claims, 10 Drawing Sheets

SEMICONDUCTOR PACKAGE WITH CO-AXIAL BALL-GRID-ARRAY

CROSS-REFERENCE TO RELATED APPLICATIONS

This application claims priority to Malaysian Application No. PI2020004493, filed on Sep. 1, 2020, which is incorporated herein in its entirety.

BACKGROUND

Conventional semiconductor packages typically have a solder ball-grid-array (BGA) pitch dimension of less than 400 μm in order to achieve package footprint reduction. However, this may result in significant increase in crosstalk coupling, especially for high-speed input/output (I/O) such as serializer/deserializer (SerDes), Thunderbolt (TBT), peripheral component interconnect express (PCIe) and universal serial bus (USB) with data rates of more than 20 Gbps.

Existing solutions to address the increase in crosstalk coupling include introducing more BGAs associated to a ground reference voltage (Vss) adjacent the high-speed I/O BGA interconnects between a package substrate and a printed circuit board. The VSS solder balls serve as shielding and/or current return path for the high-speed I/O signals. However, the increase in the number of Vss BGAs lead to package footprint and platform form-factor expansion and may inhibit device miniaturizations and interconnect density scaling.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
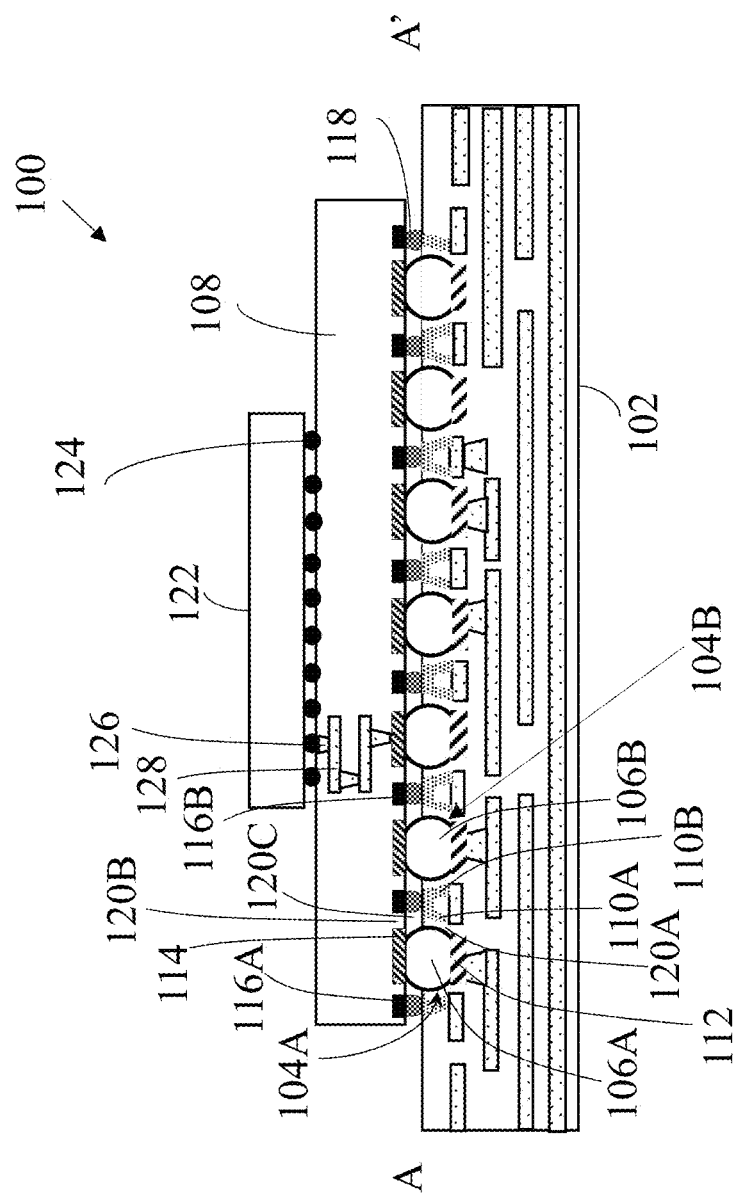
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for the present devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include an improvement in signal integrity performance for high-speed multi-Gbps signals (>20 Gbps) such as SerDes, TBT and PCIe signals. This can be achieved through minimized crosstalk coupling in the vertical transition from package to board, of which one or more BGA is surrounded with a ground referenced ring shield and/or wall. Furthermore, such vertical interconnects also avoid the need of stacked or staggered micro-vias as the vertical interconnects can reach the inner printed circuit board (PCB) layers directly thus minimizing reflection noises.

An advantage of the present disclosure may include package and platform miniaturization through reduction Vss BGAs and/or repurposing of Vss BGAs to signal BGAs for package form-factor miniaturization. Typically, up to 30% of the package BGA are allocated for Vss BGA, therefore, with a reduction in the number of Vss BGAs, the X-Y footprint of both package and platform may be reduced.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

The present disclosure generally relates to a device. The device may include a printed circuit board. The device may also include a first recess in the printed circuit board, wherein the first recess comprises a circular side surface and a bottom surface. The device may also include a first solder ball disposed in the first recess. The device may also include a first conductive wall positioned behind the circular side surface of the first recess, wherein the first conductive wall surrounds a side surface of the first solder ball.

The present disclosure generally relates to a method of forming a device. The method may include providing a printed circuit board. The method may also include forming a first recess in the printed circuit board, wherein the first recess comprises a circular side surface and a bottom surface. The method may also include forming a first solder ball in the first recess. The method may also include forming a first conductive positioned behind the circular side surface of the first recess, wherein the first conductive wall surrounds a side surface of the first solder ball.

The present disclosure generally relates to a computing device. The computing device may include a printed circuit board. The computing device may also include a first recess in the printed circuit board, the first recess comprising a circular side surface and a bottom surface. The computing device may also include a first solder ball disposed in the first recess. The computing device may also include a first conductive wall positioned behind the circular side surface of the first recess, wherein the first conductive wall surrounds a side surface of the first solder ball. The computing device may also include a semiconductor package coupled to the first solder ball.

To more readily understand and put into practical effect, the present device, computing device, method, and other particular aspects will now be described by way of examples and not limitations, and with reference to the figures. For the sake of brevity, duplicate descriptions of features and properties may be omitted.

Figures 1B, 1C:
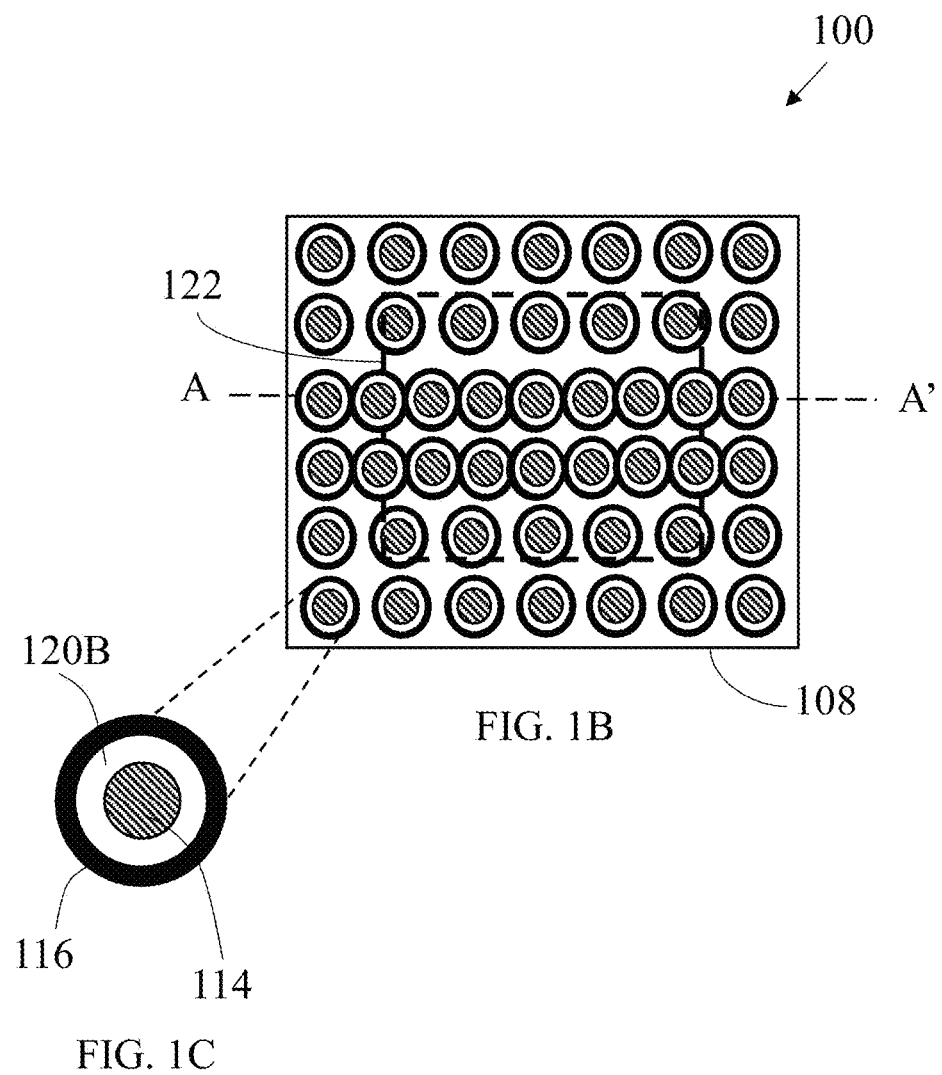
FIG. 1B shows a bottom view of a package substrate according to an aspect of the semiconductor system shown in FIG. 1A.
FIG. 1C shows an illustrative representation of the co-axial interconnect according to the package substrate shown in FIG. 1B.

FIG. 1A shows a cross-sectional view of a semiconductor package according to an aspect of the present disclosure. FIG. 1B shows a bottom view of a package substrate according to an aspect of the semiconductor system shown in FIG. 1A. FIG. 1C shows an illustrative representation of the co-axial interconnect according to the package substrate shown in FIG. 1B.

In an aspect of the present disclosure, a semiconductor package 100 is shown in FIGS. 1A and 1B. The semiconductor package 100 may be a device. The semiconductor package 100 may be a stacked semiconductor package like a 2.5D or a 3D semiconductor package.

In an aspect of the present disclosure, the semiconductor package 100 may include a motherboard 102. The motherboard 102 may be a PCB. The motherboard 102 may include contact pads, electrical interconnects, routings, and other features, which are not shown in any of the present figures.

In an aspect of the present disclosure, the motherboard 102 may include a plurality of recesses 104. The plurality of recesses 104 may be on a first surface of the motherboard 102. The plurality of recess may have a depth of 10-30% of the motherboard 102. In an aspect, each recess of the plurality of recesses 104 may have a circular side surface and a bottom surface. In an aspect, the plurality of recesses 104 may include a first recess 104A.

In an aspect of the present disclosure, the semiconductor package 100 may include a plurality of solder balls 106. In an aspect, the plurality of solder balls 106 may be disposed in the plurality of recesses 104. In an aspect, a depth of the plurality of recesses 104 may be smaller than a diameter of the plurality of solder balls 106. The plurality of solder balls 106 may extend over the first surface of the motherboard 102.

In an aspect of the present disclosure, the plurality of solder balls 106 may include a first solder ball 106A. The first solder ball 106A may be disposed in the first recess 104A.

In an aspect of the present disclosure, the semiconductor package 100 may include a package substrate 108. The package substrate 108 may include contact pads, electrical interconnects, routings, and other features, which are not shown in any of the present figures. The package substrate 108 may have one or more rigid core layers for improved structural stability or a coreless substrate package for a reduced form-factor. In other aspects, the package substrate 108 may be part of a larger substrate that supports additional semiconductor packages, and/or components.

In an aspect, the package substrate 108 may be connected to the motherboard 102 through the plurality of solder balls 106. In an aspect, the plurality of solder balls 106 may provide an electrical connection between the package substrate 108 and the motherboard 102.

In an aspect of the present disclosure, the semiconductor package 100 may include a plurality of conductive walls 110. In an aspect, the plurality of conductive walls 110 may be a plurality of metal walls. In an aspect, the plurality of conductive walls 110 may carry a ground (Vss) reference voltage. In an aspect, the plurality of conductive walls 110 may be positioned behind the circular side surfaces of the plurality of recesses 104. In an aspect, the circular side surfaces of the plurality of recesses 104 may have a front side and a back side. The plurality of conductive walls 110 may be positioned on the back side of the circular side surfaces of the plurality of recesses 104. In an aspect, the plurality of solder balls 106 may be positioned on the front side of the circular side surfaces of the plurality of recesses 104. In an aspect, each conductive wall of the plurality of conductive walls 110 may surround each solder ball of the plurality of solder balls 106. In an aspect, a conductive wall of the plurality of conductive walls 110 may surround one or more solder balls 106, e.g., a conductive wall 110 may surround two solder balls 106.

In an aspect of the present disclosure, the plurality of conductive walls 110 may include a first conductive wall 110A. In an aspect, the first conductive wall 110A may be disposed in the first recess 104A. In an aspect, the first conductive wall 110A may surround a side surface of the first solder ball 106A.

In an aspect of the present disclosure, the semiconductor package 100 may include a plurality of first contact pads 112. In an aspect, the plurality of first contact pads 112 may be disposed in the plurality of recesses 104. In an aspect, each first contact pad of the plurality of first contact pads 112 may form the bottom surface of the plurality of recesses 104. In an aspect, each first contact pad of the plurality of first contact pads 112 may be coupled to a bottom surface of each solder ball of the plurality of solder balls 106. In an aspect, the plurality of first contact pads 112 may electrically connect the plurality of solder balls 106 to the motherboard 102. In an aspect, the plurality of first contact pads 112 may be coupled to an electronic component (not shown) disposed on the motherboard 102. The electronic component may be a transceiver device, a connector or a passive decoupling or power delivery components such as a voltage regulator.

In an aspect of the present disclosure, the semiconductor package 100 may include a plurality of second contact pads 114. In an aspect, the plurality of second contact pads 114 may be BGA pads. In an aspect, the plurality of second contact pads 114 may be disposed on a bottom surface of the package substrate 108. In an aspect, each second contact pad of the plurality of second contact pads 114 may be coupled to a top surface of each solder ball of the plurality of solder balls 106. In an aspect, the plurality of second contact pads 114 may electrically connect the plurality of solder balls 106 to the package substrate 108. In an aspect, the plurality of second contact pads 114 may be coupled to one or more transmission lines. The one or more transmission lines may carry one or more electrical signals. The one or more electrical signals may be one of a high-speed USB 3.0 interconnect operating at 10 Gbps, a PCIe Gen5 interface operating at 32 Gbps or a single-ended double data rate (DDR) memory interface operating from 4200 MT/s up-to 12 GT/s. In an aspect, the plurality of second contact pads 114 may include one or more conductive layers such as a gold coated copper composite layer or a copper-nickel-gold composite layer.

In an aspect of the present disclosure, the semiconductor package 100 may include a plurality of metal shields 116. In an aspect, the metal shield 116 may be a ring shield. In an aspect, the metal shield 116 may be circular or may have a substantially circular shape. In an aspect, the plurality of metal shields 116 may carry a ground (Vss) reference voltage. In an aspect, the plurality of metal shields 116 may be disposed on the plurality of conductive walls 110. In an aspect, each metal shield of the plurality of metal shields 116 may surround each second contact pad on the plurality of solder balls 106. In an aspect, a metal shield of the plurality of metal shields 116 may surround one or more second contact pads 114, e.g., a metal shield 116 may surround two second contact pads 114. In an aspect, the plurality of metal shields 116 may include one or more conductive layers such as a gold coated copper composite layer or a copper-nickel-gold composite layer.

In an aspect of the present disclosure, the plurality of metal shields 116 may include a first metal shield 116A. In an aspect, the first metal shield 116A may be disposed on the first conductive wall 110A. In an aspect, the first metal shield 116A may surround the second contact pad 114 on the first solder ball 106A.

In an aspect of the present disclosure, the semiconductor package 100 may include a plurality of solder interconnects 118. In an aspect, the plurality of solder interconnects 118 may be disposed on the motherboard 102. The plurality of solder interconnects 118 may be adjacent to the plurality of solder balls 106. In an aspect, the plurality of solder interconnects 118 may be disposed on the plurality of conductive walls 110. In an aspect, the plurality of solder interconnects 118 may be coupled to a top surface of the first conductive wall positioned behind the circular side surface of the first recess in the motherboard. In an aspect, the plurality of solder interconnects 118 may have a second height lesser than a first height of the plurality of solder balls 106. In an aspect, the depth of the plurality of recesses 104 may be chosen based on a difference between the second height and the first height. In an aspect, the plurality of solder interconnects 118 may electrically connect the plurality of conductive walls 110 to the package substrate 108.

In an aspect of the present disclosure, the semiconductor package 100 may include a dielectric layer 120A between the plurality of solder balls 106 and the plurality of conductive walls 110. In an aspect, a dielectric layer 120B may be between the plurality of second contact pads 114 and the plurality of metal shields 116. The dielectric layers 120A, 120B may be a polymer resin layer. In an aspect, the dielectric layer 120A may form the circular side surface of the plurality of recesses 104. In an aspect, a dielectric layer 120C, e.g., an air gap, may be formed between the plurality of solder balls 106 and the plurality of solder interconnects 118.

In an aspect of the present disclosure, the solder ball 106, the second contact pad 114, the conductive wall 110 and/or the metal shield 116 may share the same axis. The solder ball 106, the second contact pad 114, the conductive wall 110, the metal shield 116, the plurality of solder interconnects 118 and/or the dielectric layers 120A, 120B and 120C may collectively be a co-axial BGA. In an aspect, the co-axial BGA may allow high frequency electrical signal transmission between the package substrate 108 and the motherboard 102 with minimized signal crosstalk coupling and signal attenuation.

In an aspect of the present disclosure, the semiconductor package 100 may include a semiconductor device 122. In an aspect, the semiconductor device 122 may be made from any suitable semiconductor, such as silicon or gallium arsenide. The semiconductor device 122 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU).

In an aspect of the present disclosure, the semiconductor device 122 may be disposed on the package substrate 108. In an aspect, a plurality of solder bumps 124 may be disposed on the package substrate 108. The plurality of solder bumps 124 may provide an electrical connection between the package substrate 108 and the semiconductor device 122.

In an aspect of the present disclosure, the package substrate 108 may include a plurality of conductive vias 126 and a plurality of conductive traces 128. The plurality of conductive vias 126 and the plurality of conductive traces 128 may provide an electrical connection between the semiconductor device 122 and the plurality of solder balls 106 through the package substrate 108.

In an aspect of the present disclosure, the plurality of recesses 104 may include a second recess 104B. The second recess 104B may be on the first surface of the motherboard 102. The second recess 104B may be adjacent to the first recess 104A.

In an aspect of the present disclosure, the plurality of solder balls 106 may include a second solder ball 106B. The second solder ball 106B may be disposed in the second recess 104B.

In an aspect of the present disclosure, the plurality of conductive walls 110 may include a second conductive wall 110B. In an aspect, the second conductive wall 110B may be disposed in the second recess 104B. In an aspect, the second conductive wall 110B may surround a side surface of the second solder ball 106B. In an aspect, the second conductive wall 110B may be in contact with the first conductive wall 110A.

In an aspect of the present disclosure, the plurality of metal shields 116 may include a second metal shield 116B. In an aspect, the second metal shield 116B may be disposed on the second conductive wall 110B. In an aspect, the second metal shield 116B may surround the second contact pad 114 on the second solder ball 106B. In an aspect, the second metal shield 116B may or may not be in contact with the first metal shield 116A.

In an aspect of the present disclosure, the first conductive wall 110A and the second conductive wall 110B may isolate the first solder ball 106A and the second solder ball 106B from each other. This may minimize crosstalk coupling of a signal carried by the first solder ball 106A and a signal carried by the second solder ball 106B.

In an aspect of the present disclosure, an underfill layer (not shown) may be deposited to cover, and to protect the solder balls 106 in a conventional manner. The underfill layer may be provided to improve the mechanical reliability of the solder balls 106. The underfill layer may be provided using either a conventional underfilling process or no-flow underfilling process to reduce the effects of thermal expansion and reduce the stress and strain on the solder balls 106.

Figure 2:
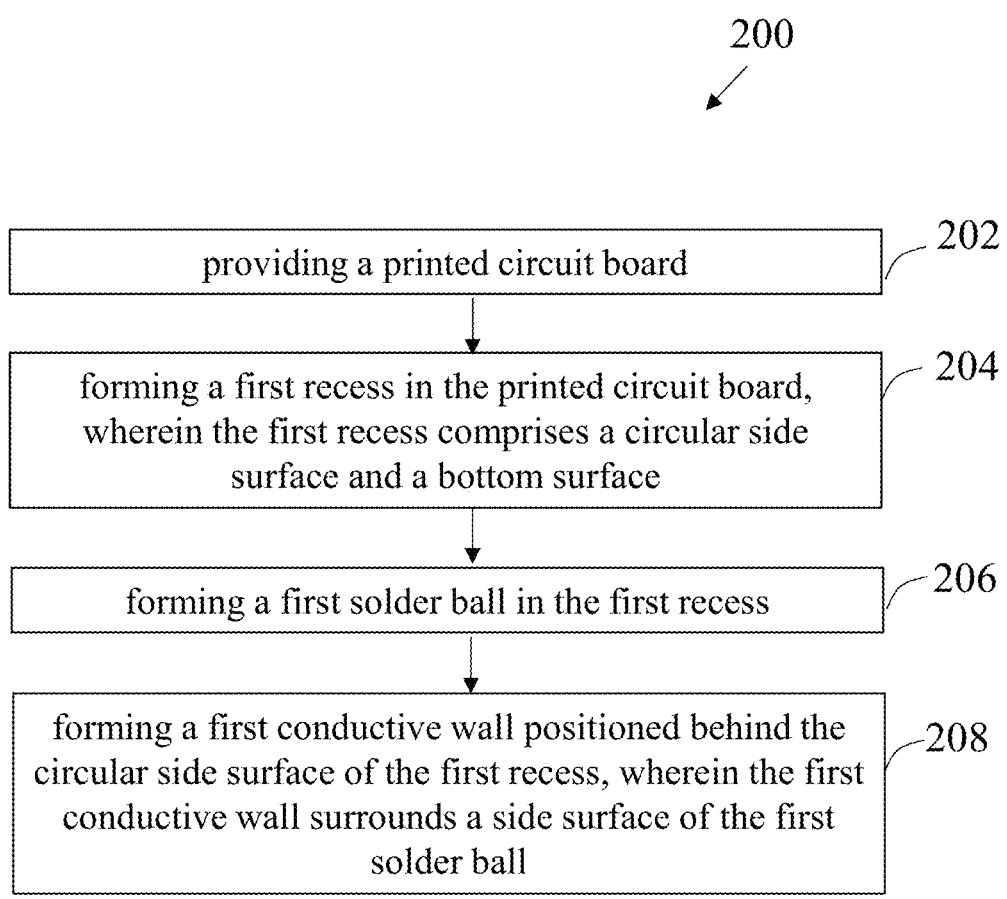
FIG. 2 shows a flow chart illustrating a method of forming a semiconductor package according to an aspect of the present disclosure.

FIG. 2 shows a flow chart illustrating a method of forming a semiconductor package according to an aspect of the present disclosure.

As shown in FIG. 2, there may be a method 200 of forming a device. In the method 200, a first operation 202 may include providing a printed circuit board. A second operation 204 may include forming a first recess in the printed circuit board, wherein the first recess comprises a circular side surface and a bottom surface. A third operation 206 may include forming a first solder ball in the first recess. A fourth operation 208 may include forming a first conductive wall positioned behind the circular side surface of the first recess, wherein the first conductive wall surrounds a side surface of the first solder ball.

It will be understood that the above operations described above relating to FIG. 2 are not limited to this particular order. Any suitable, modified order of operations may be used.

Figure 3A:
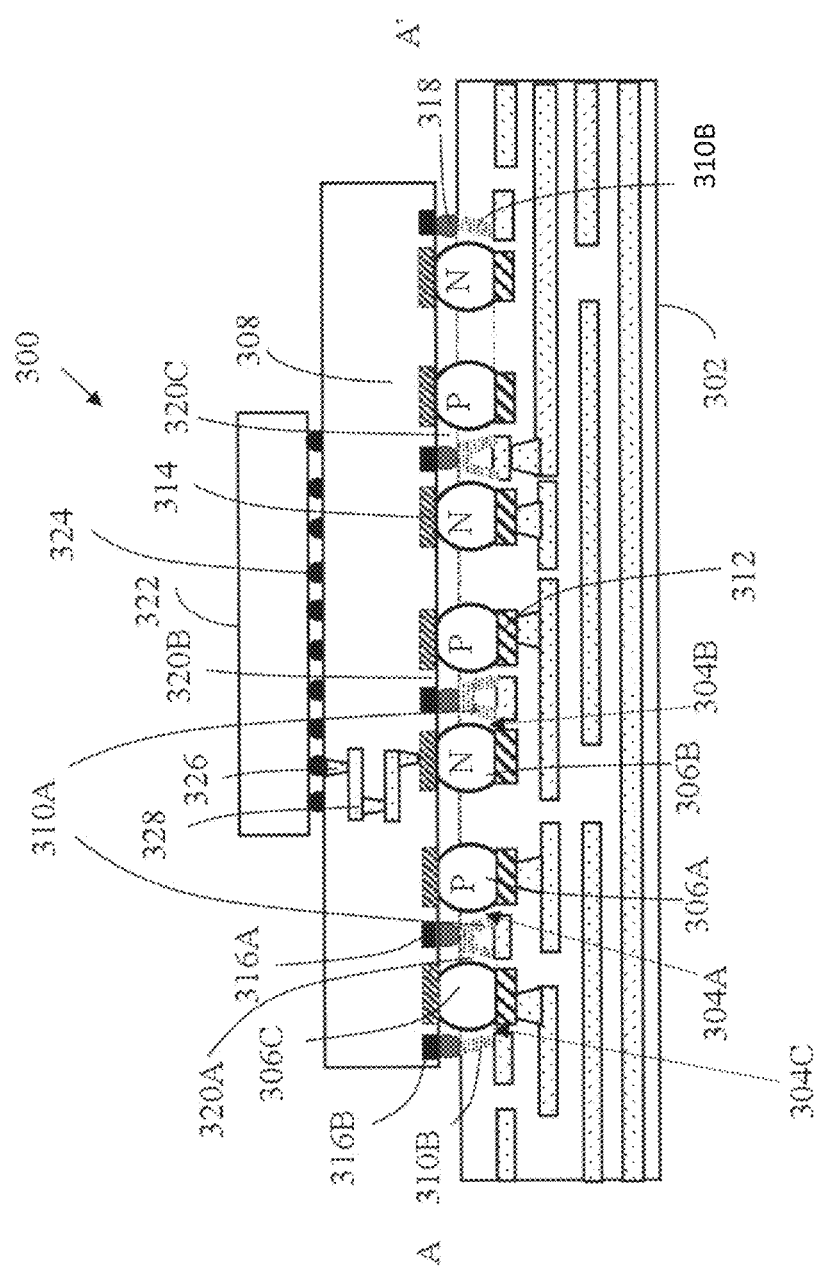
FIG. 3A shows a cross-sectional view of a semiconductor package according to an aspect of the present disclosure.
Figure 3B:
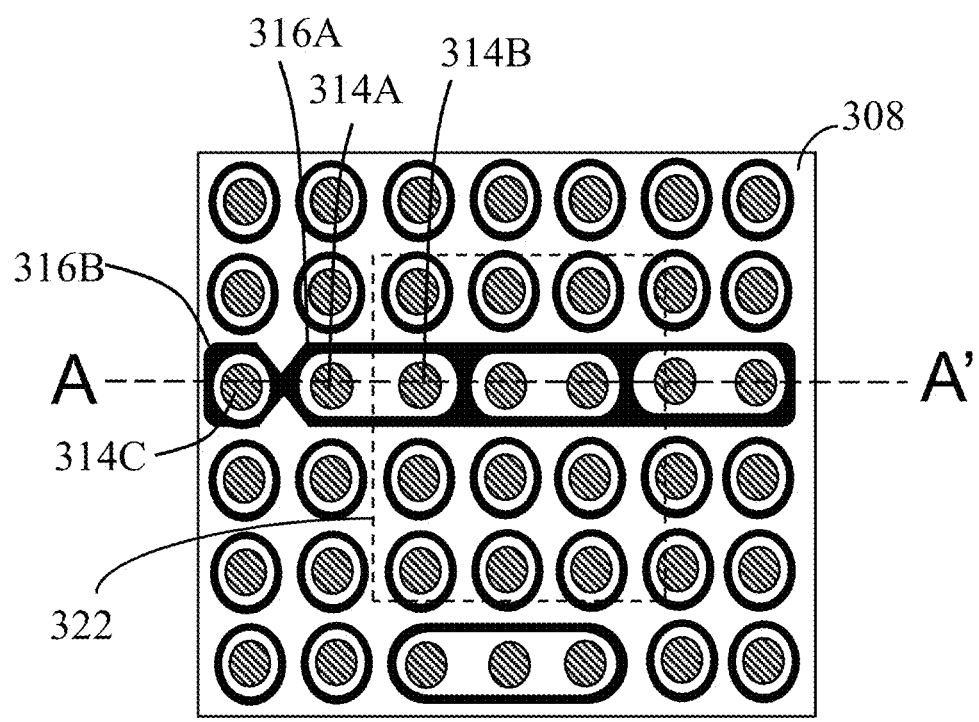
FIG. 3B shows a bottom view of a package substrate according to an aspect of the semiconductor system shown in FIG. 3A.

FIG. 3A shows a cross-sectional view of a semiconductor package according to an aspect of the present disclosure. FIG. 3B shows a bottom view of a package substrate according to an aspect of the semiconductor system shown in FIG. 3A.

In an aspect of the present disclosure, a semiconductor package 300 is shown in FIGS. 3A and 3B. The semiconductor package 300 may be a device. The semiconductor package 300 may be a stacked semiconductor package like a 2.5D or a 3D semiconductor package.

In an aspect of the present disclosure, the semiconductor package 300 may include a motherboard 302. The motherboard 302 may be a PCB. The motherboard 302 may include contact pads, electrical interconnects, routings, and other features, which are not shown in any of the present figures.

In an aspect of the present disclosure, the motherboard 302 may include a plurality of recesses 304. The plurality of recesses 304 may be on a first surface of the motherboard 302. The plurality of recess may have a depth of 10-30% of the motherboard 302. In an aspect, each recess of the plurality of recesses 304 may have a circular side surface and a bottom surface. In an aspect, the plurality of recesses 304 may include a first recess 304A.

In an aspect of the present disclosure, the semiconductor package 300 may include a plurality of solder balls 306. In an aspect, the plurality of solder balls 306 may be disposed in the plurality of recesses 304. In an aspect, a depth of the plurality of recesses 304 may be smaller than a diameter of the plurality of solder balls 306. The plurality of solder balls 306 may extend over the first surface of the motherboard 302.

In an aspect of the present disclosure, the plurality of solder balls 306 may include a first solder ball 306A. The first solder ball 306A may be disposed in the first recess 304A.

In an aspect of the present disclosure, the plurality of recesses 304 may include a second recess 304B. The second recess 304B may be on the first surface of the motherboard 302. The second recess 304B may be adjacent to the first recess 304A. In an aspect, the second recess 304B may form an extension from the first recess 304A.

In an aspect of the present disclosure, the plurality of solder balls 306 may include a second solder ball 306B. The second solder ball 306B may be disposed in the second recess 304B.

In an aspect of the present disclosure, the semiconductor package 300 may include a package substrate 308. The package substrate 308 may include contact pads, electrical interconnects, routings, and other features, which are not shown in any of the present figures. The package substrate 308 may have one or more rigid core layers for improved structural stability or a coreless substrate package for a reduced form-factor. In other aspects, the package substrate 308 may be part of a larger substrate that supports additional semiconductor packages, and/or components.

In an aspect, the package substrate 308 may be connected to the motherboard 302 through the plurality of solder balls 306. In an aspect, the plurality of solder balls 306 may provide an electrical connection between the package substrate 308 and the motherboard 302.

In an aspect of the present disclosure, the semiconductor package 300 may include a plurality of conductive walls 310. In an aspect, the plurality of conductive walls 310 may be a plurality of metal walls. In an aspect, the plurality of conductive walls 310 may carry a ground (Vss) reference voltage. In an aspect, the plurality of conductive walls 310 may be positioned behind the circular side surfaces of the plurality of recesses 304. In an aspect, the circular side surfaces of the plurality of recesses 304 may have a front side and a back side. The plurality of conductive walls 310 may be positioned on the back side of the circular side surfaces of the plurality of recesses 304. In an aspect, the plurality of solder balls 306 may be positioned on the front side of the circular side surfaces of the plurality of recesses 304. In an aspect, each conductive wall of the plurality of conductive walls 310 may surround each solder ball of the plurality of solder balls 306. In an aspect, a conductive wall of the plurality of conductive walls 310 may surround one or more solder balls 306, e.g., a conductive wall 310 may surround two solder balls 306.

In an aspect of the present disclosure, the plurality of conductive walls 310 may include a first conductive wall 310A. In an aspect, the first conductive wall 310A may be disposed in the first recess 304A and the second recess 304B. In an aspect, the first conductive wall 310A may extends to be positioned behind a circular side surface of the second recess. In an aspect, the first conductive wall 310A may surround a side surface of the first solder ball 306A and a side surface of the second solder ball 306B.

In an aspect of the present disclosure, the semiconductor package 300 may include a plurality of first contact pads 312. In an aspect, the plurality of first contact pads 312 may be disposed in the plurality of recesses 304. In an aspect, each first contact pad of the plurality of first contact pads 312 may form the bottom surface of the plurality of recesses 304. In an aspect, each first contact pad of the plurality of first contact pads 312 may be coupled to a bottom surface of each solder ball of the plurality of solder balls 306. In an aspect, the plurality of first contact pads 312 may electrically connect the plurality of solder balls 306 to the motherboard 302. In an aspect, the plurality of first contact pads 312 may be coupled to an electronic component (not shown) disposed on the motherboard 302. The electronic component may be a transceiver device, a connector or a passive decoupling or power delivery components such as a voltage regulator.

In an aspect of the present disclosure, the semiconductor package 300 may include a plurality of second contact pads 314. In an aspect, the second contact pads 314 may be BGA pads. In an aspect, the plurality of second contact pads 314 may be disposed on a bottom surface of the package substrate 308. In an aspect, each second contact pad of the plurality of second contact pads 314 may be coupled to a top surface of each solder ball of the plurality of solder balls 306. In an aspect, the plurality of second contact pads 314 may electrically connect the plurality of solder balls 306 to the package substrate 308. In an aspect, the plurality of second contact pads 314 may be coupled to one or more transmission lines. The one or more transmission lines may carry one or more electrical signals. The one or more electrical signals may be one of a high-speed USB 3.0 interconnects operating at 10 Gbps, a PCIe Gen5 interface operating at 32 Gbps or a single-ended DDR memory interface operating from 4200 MT/s up-to 12 GT/s. In an aspect, the plurality of second contact pads 314 may include one or more conductive layers such as a gold coated copper composite layer or a copper-nickel-gold composite layer.

In an aspect of the present disclosure, the semiconductor package 300 may include a plurality of metal shields 316. In an aspect, the metal shield 316 may be a ring shield. In an aspect, the metal shield 316 may be circular or may have a substantially circular shape. In an aspect, the plurality of metal shields 316 may carry a ground (Vss) reference voltage. In an aspect, the plurality of metal shields 316 may be disposed on the plurality of conductive walls 310. In an aspect, each metal shield of the plurality of metal shields 316 may surround each second contact pad on the plurality of solder balls 306. In an aspect, a metal shield of the plurality of metal shields 316 may surround one or more second contact pads 314, e.g., a metal shield 316 may surround two second contact pads 314. In an aspect, the plurality of metal shields 316 may include one or more conductive layers such as a gold coated copper composite layer or a copper-nickel-gold composite layer.

In an aspect of the present disclosure, the plurality of metal shields 316 may include a first metal shield 316A. In an aspect, the first metal shield 316A may be disposed on the first conductive wall 310A. In an aspect, the first metal shield 316A may surround the second contact pad 314A on the first solder ball 306A and the second contact pad 314B of the second solder ball 306B.

In an aspect, the second contact pads 314 of the first solder ball 306A and the second solder ball 306B may be from differential pair transmission line. The second contact pads 314 may have one or more transmission lines which are a portion of a single-ended memory byte which may include 8 data (DQ) lanes and 2 strobe (DQS) lanes. In an aspect, the second contact pads 314 may carry a complementary (P/N) or differential (D+/D−) electrical signal e.g., a high-speed USB 3.0 interconnect operating at 10 Gbps, or a PCIe Gen5 interface operating at 32 Gbps.

In an aspect of the present disclosure, the semiconductor package 300 may include a plurality of solder interconnects 318. In an aspect, the plurality of solder interconnects 318 may be disposed on the motherboard 302. The plurality of solder interconnects 318 may be adjacent to the plurality of solder balls 306. In an aspect, the plurality of solder interconnects 318 may be disposed on the plurality of conductive walls 310. In an aspect, the plurality of solder interconnects 318 may be coupled to a top surface of the first conductive wall positioned behind the circular side surface of the first recess in the motherboard. In an aspect, the plurality of solder interconnects 318 may have a second height lesser than a first height of the plurality of solder balls 306. In an aspect, the depth of the plurality of recesses 304 may be chosen based on a difference between the second height and the first height. In an aspect, the plurality of solder interconnects 318 may electrically connect the plurality of conductive walls 310 to the package substrate 308.

In an aspect of the present disclosure, the semiconductor package 300 may include a dielectric layer 320A between the plurality of solder balls 106 and the plurality of conductive walls 310. In an aspect, a dielectric layer 320B may be between the plurality of second contact pads and the plurality of metal shields 316. The dielectric layer 320A, 320B may be a polymer resin layer. In an aspect, the dielectric layer 320 may form the circular side surface of the plurality of recesses 304. In an aspect, a dielectric layer 320C, e.g., an air gap, may be formed between the plurality of solder balls 306 and the plurality of solder interconnects 318.

In an aspect of the present disclosure, the semiconductor package 300 may include a semiconductor device 322. In an aspect, the semiconductor device 322 may be made from any suitable semiconductor, such as silicon or gallium arsenide.

The semiconductor device 322 may be a semiconductor die, a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU).

In an aspect of the present disclosure, the semiconductor device 322 may be disposed on the package substrate 308. In an aspect, a plurality of solder bumps 324 may be disposed on the package substrate 308. The plurality of solder bumps 324 may provide an electrical connection between the package substrate 308 and the semiconductor device 322.

In an aspect of the present disclosure, the package substrate 308 may include a plurality of conductive vias 326 and a plurality of conductive traces 328. The plurality of conductive vias 326 and the plurality of conductive traces 328 may provide an electrical connection between the semiconductor device 322 and the plurality of solder balls 306 through the package substrate 308.

In an aspect of the present disclosure, the plurality of recesses 304 may include a third recess 304C. The third recess 304C may be on the first surface of the motherboard 302. The third recess 304C may be adjacent to the first recess 304A and/or the second recess 304B.

In an aspect of the present disclosure, the plurality of solder balls 306 may include a third solder ball 306C. The third solder ball 306C may be disposed in the third recess 304C.

In an aspect of the present disclosure, the plurality of conductive walls 310 may include a second conductive wall 310B. In an aspect, the second conductive wall 310B may be disposed in the third recess 304B. In an aspect, the second conductive wall 310B may surround a side surface of the third solder ball 306C. In an aspect, the second conductive wall 310B may be in contact with the first conductive wall 310A.

In an aspect of the present disclosure, the plurality of metal shields 316 may include a second metal shield 316B. In an aspect, the second metal shield 316B may be disposed on the second conductive wall 310B. In an aspect, the second metal shield 316B may surround the second contact pad 312C on the third solder ball 306C. In an aspect, the second metal shield 316B may or may not be in contact with the first metal shield 316A.

In an aspect of the present disclosure, the first conductive wall 310A and the second conductive wall 310B may isolate the first solder ball 306A and the third solder ball 306C from each other. This may minimize crosstalk coupling of a signal carried by the first solder ball 306A and a signal carried by the third solder ball 306C. In an aspect, the first conductive wall 310A and the second conductive wall 310B may also isolate the second solder ball 306B and the third solder ball 306C from each other. This may minimize crosstalk coupling of a signal carried by the second solder ball 306B and a signal carried by the third solder ball 306C.

In an aspect of the present disclosure, an underfill layer (not shown) may be deposited to cover, and to protect the solder balls 306 in a conventional manner. The underfill layer may be provided to improve the mechanical reliability of the solder balls 306. The underfill layer may be provided using either a conventional underfilling process or no-flow underfilling process to reduce the effects of thermal expansion and reduce the stress and strain on the solder balls 306.

Figure 4A:
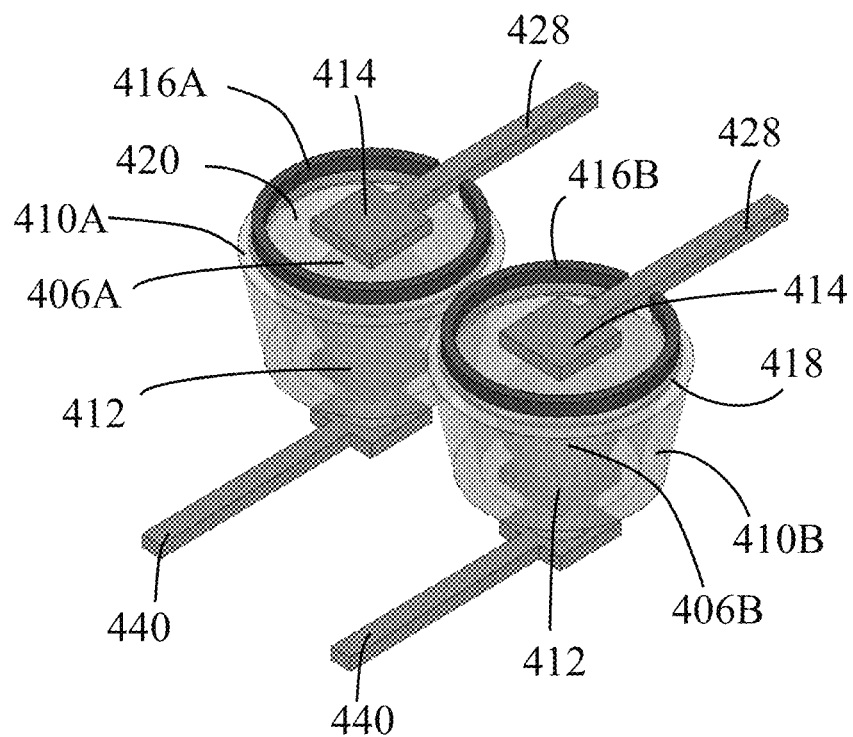
FIG. 4A shows a perspective view of a co-axial BGA interconnect according to an aspect of the present disclosure.

FIG. 4A shows a perspective view of a co-axial BGA interconnect according to an aspect of the present disclosure.

As shown in FIG. 4A, a first solder ball 406A may be surrounded by a first conductive wall 410A. In an aspect, a first contact pad 412 may be disposed on a bottom surface of the first solder ball 406A. The first contact pad 412 may be coupled to a conductive trace 440 on a motherboard (not shown). In an aspect, a second contact pad 414 may be disposed on a top surface of the first solder ball 406A. The second contact pad 414 may be coupled to a conductive trace 428 on a package substrate (not shown). In an aspect, the second contact pad 414 of the first solder ball 406A may be surrounded by a first metal shield 416A. A dielectric material 420 may be disposed between the first metal shield 416A and the second contact pad 414. In an aspect, the first metal shield 416A may be coupled to a top surface of the first conductive wall 410A by a solder interconnect 418.

In an aspect, a second solder ball 406B may be surrounded by a second conductive wall 410B. In an aspect, a first contact pad 412 may be disposed on a bottom surface of the second solder ball 406B. The first contact pad 412 may be coupled to a conductive trace 440 on a motherboard (not shown). In an aspect, a second contact pad 414 may be disposed on a top surface of the second solder ball 406B. The second contact pad 414 may be coupled to a conductive trace 428 on a package substrate (not shown). In an aspect, the second contact pad 414 of the second solder ball 406B may be surrounded by a second metal shield 416B. A dielectric material 420 may be disposed between the second metal shield 416B and the second contact pad 414. In an aspect, the second metal shield 416B may be coupled to a top surface of the second conductive wall 410B by a solder interconnect 418.

In an aspect, the second contact pads 414 may be coupled to a single-ended routing traces on the package substrate. The single-ended routing traces may carry one or more electrical signals such as a DDR memory interface operating from 4200 MT/s up-to 12 GT/s.

Figure 4B:
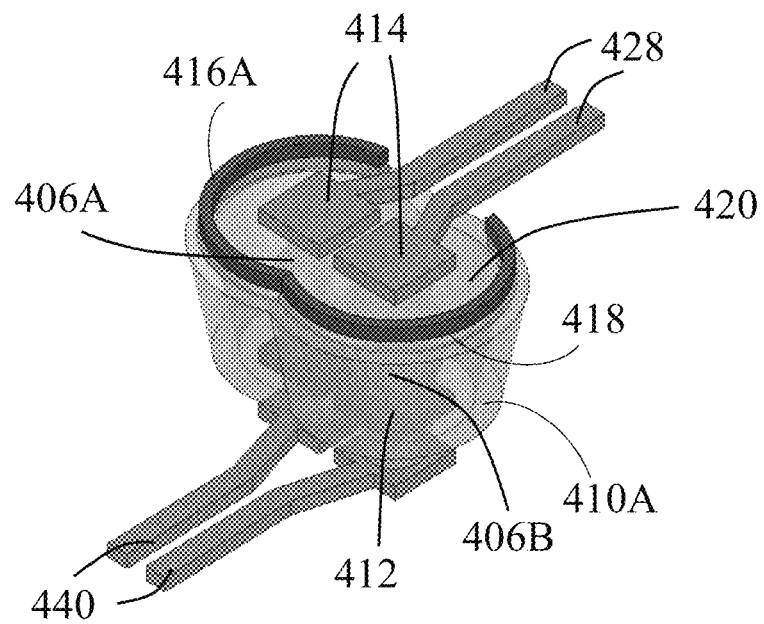
FIG. 4B shows a perspective view of a co-axial BGA interconnect according to an aspect of the present disclosure.

FIG. 4B shows a perspective view of a co-axial BGA interconnect according to an aspect of the present disclosure.

As shown in FIG. 4B, a first solder ball 406A and a second solder ball 406B may be surrounded by a first conductive wall 410A. In an aspect, first contact pads 412 may be disposed on a bottom surface of the first solder ball 406A and a bottom surface of the second solder ball 406B. The first contact pads 412 may be coupled to conductive traces 440 on a motherboard (not shown). In an aspect, second contact pads 414 may be disposed on a top surface of the first solder ball 406A and a top surface of the second solder ball 406B. The second contact pad 414 may be coupled to conductive traces 428 on a package substrate (not shown). In an aspect, the second contact pad 414 of the first solder ball 406A and the second contact pad 414 of the second solder ball 406B may be surrounded by a first metal shield 416A. A dielectric material 420 may be disposed between the first metal shield 416A and the second contact pads 414. In an aspect, the first metal shield 416A may be coupled to a top surface of the first conductive wall 410A by a solder interconnect 418.

In an aspect, the second contact pads 414 may be coupled to differential routing traces on the package substrate. The differential routing traces may carry one or more electrical signals such as a complementary (P/N) or differential (D+/D−) electrical signal e.g., a high-speed USB 3.0 interconnect operating at 10 Gbps, or PCIe Gen5 interface operating at 32 Gbps.

FIGS. 5A through 5H show cross-sectional views directed to an exemplary process flow for a method of forming a semiconductor package according to an aspect of the present disclosure.

Figure 5A:
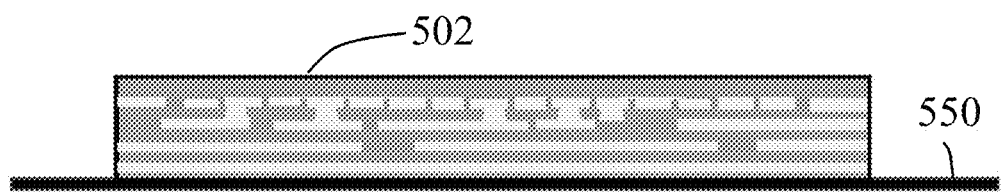
FIGS. 5A through 5H show cross-sectional views directed to an exemplary process flow for a method of forming a semiconductor package according to an aspect of the present disclosure.

As shown in FIG. 5A, a PCB 502 may be provided. The PCB 502 may be a multi-layer PCB. The PCB 502 may include a plurality of conductive traces. The PCB 502 may include dielectric layers between the plurality of conductive traces. The PCB 502 may be disposed on a carrier 550 through an adhesion, hot press or a lamination process.

Figure 5B:
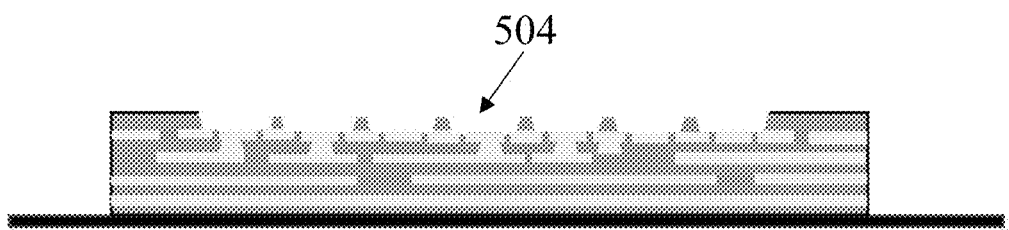

As shown in FIG. 5B, a plurality of recesses 504 may be formed in the PCB 502 using an etching, a mechanical drilling and/or laser drilling process.

Figure 5C:
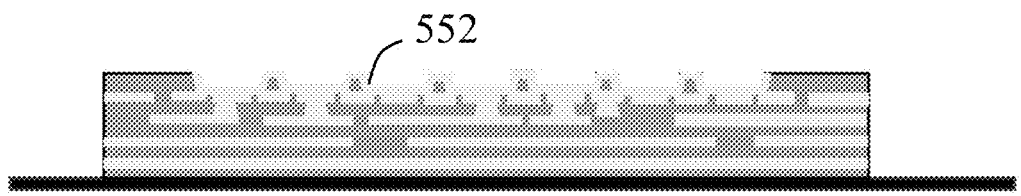

As shown in FIG. 5C, a conductive layer 552 such as a Cu layer may be disposed in the plurality of recesses 504 using an electrolysis and/or an electrolytic plating process.

Figure 5D:
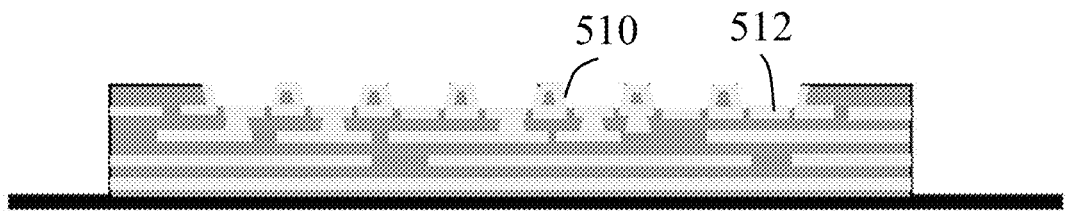

As shown in FIG. 5D, a portion of the conductive layer 552 disposed in FIG. 5C may be removed from the bottom of the plurality of recesses 504 using chemical and/or laser etching process. The portion of the conductive layer 552 may be removed to expose a plurality of first contact pads 512 and to form a plurality of conductive walls 510.

Figure 5E:
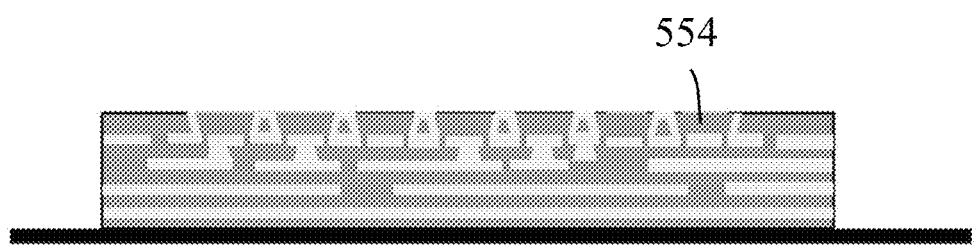

As shown in FIG. 5E, a dielectric layer 554 e.g., an epoxy dry film resist (DFR) layer may be disposed in the plurality of recesses 504 using a spin coating, a printing, a hot press and/or lamination process.

Figure 5F:
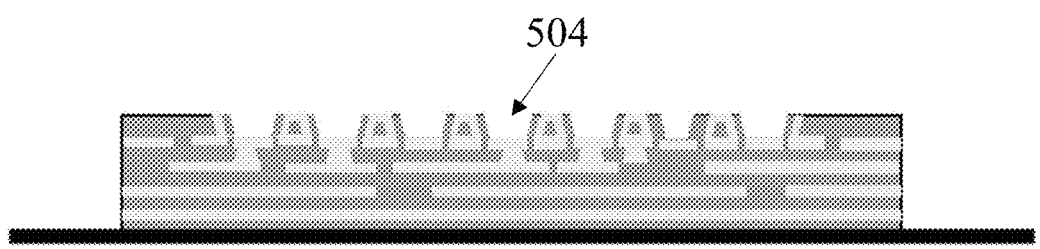

As shown in FIG. 5F, a portion of the dielectric layer 554 disposed in FIG. 5E may be removed using an etching, a mechanical and/or laser drilling process to form a plurality of circular side surfaces within the recesses 504.

Figure 5G:
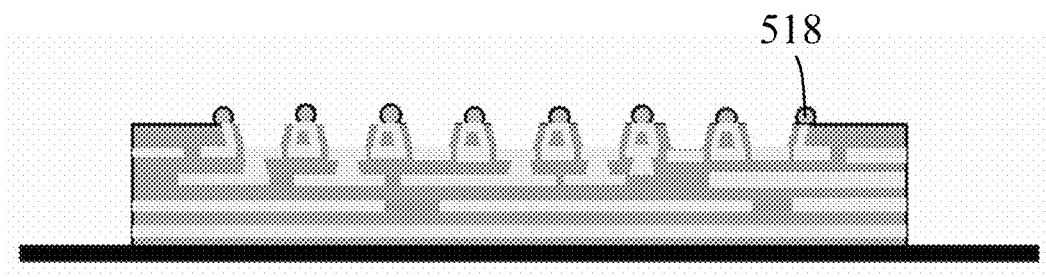

As shown in FIG. 5G, a plurality of solder interconnects 518 may be disposed on a surface of the PCB 502 using a dispensing process and/or a stencil printing process.

Figure 5H:
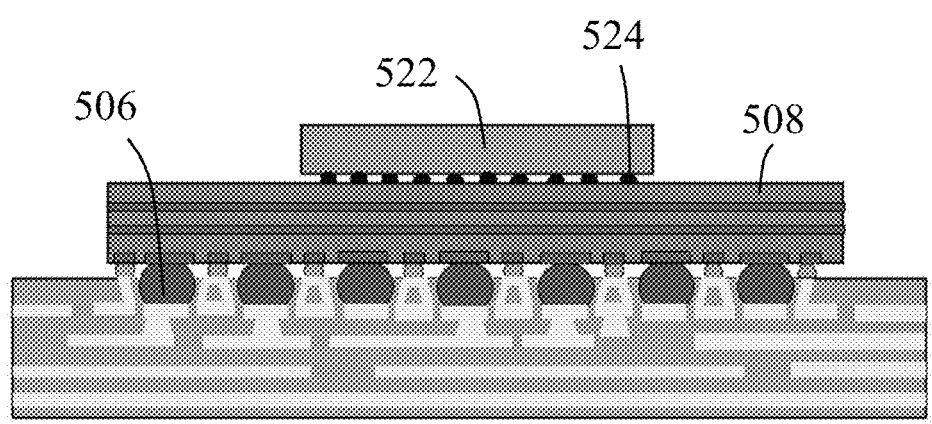

As shown in FIG. 5H, a plurality of solder balls 506 may be disposed in the plurality of recesses 504 using a solder reflow process. A package substrate 502 may be disposed on the PCB 502 through the plurality of solder balls 506 and the plurality of solder interconnects 518. A semiconductor device 522 may be disposed on the package substrate 502 through a plurality of solder bumps 524.

It will be understood that the exemplary process described above relating to FIGS. 5A through 5H are not limited to this particular order. Any suitable, modified order of operations may be used.

Aspects of the present disclosure may be implemented into a system using any suitable hardware and/or software.

Figure 6:
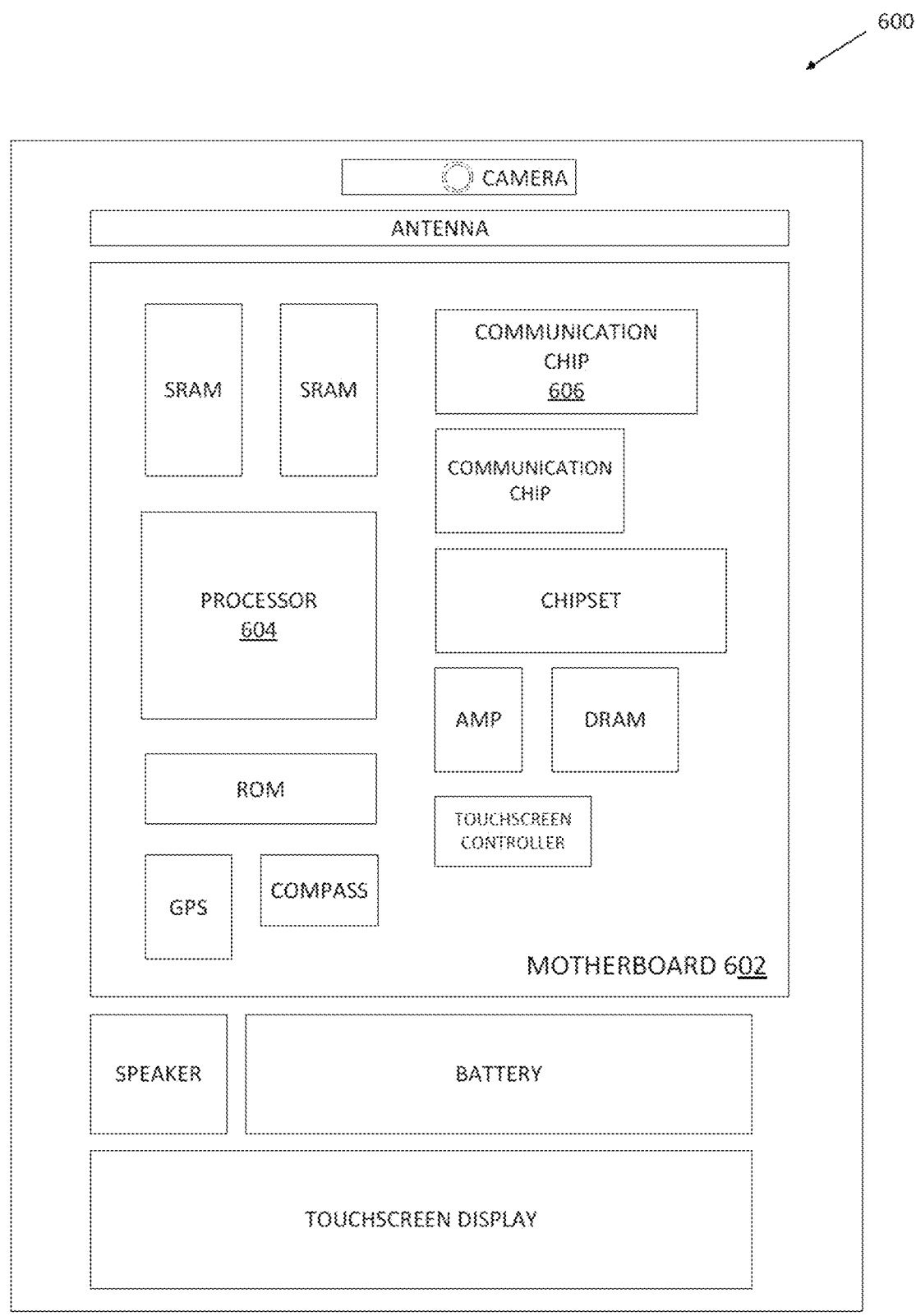
FIG. 6 shows an illustration of a computing device that includes a semiconductor package according to a further aspect of the present disclosure.

FIG. 6 schematically illustrates a computing device 600 that may include a semiconductor package as described herein, in accordance with some aspects.

As shown in FIG. 6, the computing device 600 may house a board such as a motherboard 602. The motherboard 602 may include a number of components, including but not limited to a processor 604 and at least one communication chip 606. The processor 604 may be physically and electrically coupled to the motherboard 602. In some implementations, the at least one communication chip 606 may also be physically and electrically coupled to the motherboard 602. In further implementations, the communication chip 606 may be part of the processor 604.

Depending on its applications, computing device 600 may include other components that may or may not be physically and electrically coupled to the motherboard 602. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 604 of the computing device 600 may be packaged in a semiconductor package, as described herein, and/or other semiconductor devices may be packaged together in a semiconductor package as described herein.

The communication chip 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 606 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 606 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 606 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 606 may operate in accordance with other wireless protocols in other aspects.

The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 600 may be a mobile computing device. In further implementations, the computing device 600 may be any other electronic device that processes data.

Examples

Example 1 may include a device including: a printed circuit board; a first recess in the printed circuit board, in which the first recess includes a circular side surface and a bottom surface; a first solder ball disposed in the first recess; and a first conductive wall positioned behind the circular side surface of the first recess, in which the first conductive wall surrounds a side surface of the first solder ball.

Example 2 may include the device of example 1 and/or any other example disclosed herein, further including: a package substrate positioned over the printed circuit board; a first contact pad forming the bottom surface of the first recess and coupled to a bottom surface of the first solder ball, in which the first contact pad electrically connects the first solder ball to the printed circuit board; and a second contact pad on a bottom surface of the package substrate and coupled to a top surface of the first solder ball, in which the second contact pad electrically connects the first solder ball to the package substrate.

Example 3 may include the device of example 1 and/or any other example disclosed herein, further including: a solder interconnect coupled to a top surface of the first conductive wall positioned behind the circular side surface of the first recess in the printed circuit board, in which the solder interconnect has a second height that is lesser than a first height of the first solder ball, and in which the solder interconnect electrically connects the first conductive wall to the package substrate.

Example 4 may include the device of example 2 and/or any other example disclosed herein, further including: a first metal shield disposed over the first conductive wall, in which the first metal shield surrounds the second contact pad.

Example 5 may include the device of example 4 and/or any other example disclosed herein, in which the first conductive wall and the first metal shield carry a ground reference voltage (Vss).

Example 6 may include the device of example 1 and/or any other example disclosed herein, further including: a dielectric layer forming the circular side surface of the first recess between the first solder ball and the first conductive wall.

Example 7 may include the device of example 1 and/or any other example disclosed herein, further including: a second recess in the printed circuit board; a second solder ball disposed in the second recess, in which the second recess is adjacent to the first recess and the second solder ball is adjacent to the first solder ball.

Example 8 may include the device of example 7 and/or any other example disclosed herein, in which the second recess forms an extension from the first recess, and in which the first conductive wall extends to be positioned behind a circular side surface of the second recess and surrounds both the side surface of the first solder ball and a side surface of the second solder ball.

Example 9 may include the device of example 7 and/or any other example disclosed herein, further including: a second conductive wall surrounding a side surface of the second solder ball.

Example 10 may include a method including: providing a printed circuit board; forming a first recess in the printed circuit board, in which the first recess includes a circular side surface and a bottom surface; forming a first solder ball in the first recess; and forming a first conductive wall positioned behind the circular side surface of the first recess, in which the first conductive wall surrounds a side surface of the first solder ball.

Example 11 may include the method of example 10 and/or any other example disclosed herein, further including: forming a package substrate over the printed circuit board;

forming a first contact pad on the bottom surface of the first recess and coupling the first contact pad to a bottom surface of the first solder ball, in which the first contact pad electrically connects the first solder ball to the printed circuit board; and forming a second contact pad on a bottom surface of the package substrate and coupling the second contact pad to a top surface of the first solder ball, in which the second contact pad electrically connects the first solder ball to the package substrate.

Example 12 may include the method of example 10 and/or any other example disclosed herein, further including: positioning a solder interconnect behind the circular side surface of the first recess in the printed circuit board, and coupling the solder interconnect to a top surface of the first conductive wall, in which the solder interconnect has a second height lesser than a first height of the first solder ball, and in which the solder interconnect electrically connects the first conductive wall to the package substrate.

Example 13 may include the method of example 11 and/or any other example disclosed herein, further including: forming a first metal shield over the first conductive wall, in which the first metal shield surrounds the second contact pad.

Example 14 may include the method of example 10 and/or any other example disclosed herein, further including: forming a second recess in the printed circuit board; forming a second solder ball in the second recess, in which the second recess is adjacent to the first recess and the second solder ball is adjacent to the first solder ball.

Example 15 may include the method of example 14 and/or any other example disclosed herein, in which the second recess forms an extension from the first recess, and in which the first conductive wall extends to be positioned behind a circular side surface of the second recess and surrounds both the side surface of the first solder ball and a side surface of the second solder ball.

Example 16 may include the method of example 14 and/or any other example disclosed herein, further including: forming a second conductive wall surrounding a side surface of the second solder ball.

Example 17 may include a computing device including: a printed circuit board; a first recess in the printed circuit board, the first recess including a circular side surface and a bottom surface; a first solder ball disposed in the first recess; and a first conductive wall positioned behind the circular side surface of the first recess, in which the first conductive wall surrounds a side surface of the first solder ball; and a semiconductor package coupled to the first solder ball.

Example 18 may include the computing device of example 17 and/or any other example disclosed herein, further including: a second recess on the printed circuit board; and a second solder ball disposed in the second recess, in which the second recess is adjacent to the first recess and the second solder ball is adjacent to the first solder ball.

Example 19 may include the computing device of example 18 and/or any other example disclosed herein, in which the second recess forms an extension from the first recess, and in which the first conductive wall extends to be positioned behind a circular side surface of the second recess and surrounds both the side surface of the first solder ball and a side surface of the second solder ball.

Example 20 may include the computing device of example 18 and/or any other example disclosed herein, further including: a second conductive wall surrounding a side surface of the second solder ball.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific system or device may also hold for any system or device described herein. It will also be understood that any property described herein for a specific method may hold for any of the methods described herein. Furthermore, it will be understood that for any device, system, or method described herein, not necessarily all the components or operations described will be enclosed in the device, system, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a printed circuit board;
   a first recess in the printed circuit board, wherein the first recess comprises a circular side surface and a bottom surface;
   a first solder ball disposed in the first recess; and
   wherein the circular side surface comprises a dielectric layer and a first conductive wall, the first conductive wall being electrically conductively connected to a ground reference voltage; and
   wherein the dielectric layer is between the first conductive wall and the first solder ball.

2. The device of claim 1, further comprising:
   a package substrate positioned over the printed circuit board;
   a first contact pad forming the bottom surface of the first recess and coupled to a bottom surface of the first solder ball, wherein the first contact pad electrically connects the first solder ball to the printed circuit board; and
   a second contact pad on a bottom surface of the package substrate and coupled to a top surface of the first solder ball, wherein the second contact pad electrically connects the first solder ball to the package substrate.

3. The device of claim 1, further comprising:
   a solder interconnect coupled to a top surface of the first conductive wall positioned behind the circular side surface of the first recess in the printed circuit board, wherein the solder interconnect has a second height that is lesser than a first height of the first solder ball, and wherein the solder interconnect electrically connects the first conductive wall to the package substrate.

4. The device of claim 2, further comprising:
a first metal shield disposed over the first conductive wall, wherein the first metal shield surrounds the second contact pad.

5. The device of claim 4, wherein the first metal shield carries a ground reference voltage (Vss).

6. The device of claim 1, further comprising:
a dielectric layer forming the circular side surface of the first recess between the first solder ball and the first conductive wall.

7. The device of claim 1, further comprising:
a second recess in the printed circuit board;
a second solder ball disposed in the second recess, wherein the second recess is adjacent to the first recess and the second solder ball is adjacent to the first solder ball.

8. The device of claim 7, wherein the second recess forms an extension from the first recess, and wherein the first conductive wall extends to be positioned behind a circular side surface of the second recess and surrounds both the side surface of the first solder ball and a side surface of the second solder ball.

9. The device of claim 7, further comprising:
a second conductive wall surrounding a side surface of the second solder ball.

10. A method comprising:
providing a printed circuit board;
forming a first recess in the printed circuit board, wherein the first recess comprises a circular side surface and a bottom surface;
forming a first solder ball in the first recess; and
forming a first conductive wall within the circular side surface;
wherein the circular side surface comprises a dielectric layer and the first conductive wall, the first conductive wall being electrically conductively connected to a ground reference voltage; and
wherein the dielectric layer is between the first conductive wall and the first solder ball.

11. The method of claim 10, further comprising:
forming a package substrate over the printed circuit board;
forming a first contact pad on the bottom surface of the first recess and coupling the first contact pad to a bottom surface of the first solder ball, wherein the first contact pad electrically connects the first solder ball to the printed circuit board; and
forming a second contact pad on a bottom surface of the package substrate and coupling the second contact pad to a top surface of the first solder ball, wherein the second contact pad electrically connects the first solder ball to the package substrate.

12. The method of claim 10, further comprising:
positioning a solder interconnect behind the circular side surface of the first recess in the printed circuit board, and coupling the solder interconnect to a top surface of the first conductive wall, wherein the solder interconnect has a second height lesser than a first height of the first solder ball, and wherein the solder interconnect electrically connects the first conductive wall to the package substrate.

13. The method of claim 11, further comprising:
forming a first metal shield over the first conductive wall, wherein the first metal shield surrounds the second contact pad.

14. The method of claim 10, further comprising:
forming a second recess in the printed circuit board;
forming a second solder ball in the second recess, wherein the second recess is adjacent to the first recess and the second solder ball is adjacent to the first solder ball.

15. The method of claim 14, wherein the second recess forms an extension from the first recess, and wherein the first conductive wall extends to be positioned behind a circular side surface of the second recess and surrounds both the side surface of the first solder ball and a side surface of the second solder ball.

16. The method of claim 14, further comprising:
forming a second conductive wall surrounding a side surface of the second solder ball.

17. A computing device comprising:
a printed circuit board;
a first recess in the printed circuit board, the first recess comprising a circular side surface and a bottom surface;
a first solder ball disposed in the first recess; and
wherein the circular side surface comprises a dielectric layer and a first conductive wall, the first conductive wall being electrically conductively connected to a ground reference voltage; and
wherein the dielectric layer is between the first conductive wall and the first solder ball.

18. The computing device of claim 17, further comprising:
a second recess on the printed circuit board;
a second solder ball disposed in the second recess, wherein the second recess is adjacent to the first recess and the second solder ball is adjacent to the first solder ball.

19. The computing device of claim 18, wherein the second recess forms an extension from the first recess, and wherein the first conductive wall extends to be positioned behind a circular side surface of the second recess and surrounds both the side surface of the first solder ball and a side surface of the second solder ball.

20. The computing device of claim 18, further comprising:
a second conductive wall surrounding a side surface of the second solder ball.

* * * * *